(12) United States Patent
Kikuchi et al.

(10) Patent No.: US 10,707,676 B2
(45) Date of Patent: Jul. 7, 2020

(54) ELECTRIC WIRE PROTECTION DEVICE

(71) Applicants: Yazaki Corporation, Tokyo (JP); HONDA MOTOR CO., LTD., Tokyo (JP)

(72) Inventors: Takashi Kikuchi, Shizuoka (JP); Keisuke Ueta, Shizuoka (JP); Syunsuke Nagakura, Shizuoka (JP); Takahiro Miyakawa, Shizuoka (JP); Tomoya Nishino, Saitama (JP); Noboru Ujigawa, Saitama (JP); Seiju Kawamata, Saitama (JP); Masataka Tsukioka, Saitama (JP); Rikuya Ezoe, Saitama (JP)

(73) Assignees: YAZAKI CORPORATION, Minato-ku, Tokyo (JP); HONDA MOTOR CO., LTD., Minato-ku, Tokyo (JP)

( * ) Notice: Subject to any disclaimer, the term of this patent is extended or adjusted under 35 U.S.C. 154(b) by 332 days.

(21) Appl. No.: 15/911,492

(22) Filed: Mar. 5, 2018

(65) Prior Publication Data
US 2018/0261998 A1 Sep. 13, 2018

(30) Foreign Application Priority Data
Mar. 13, 2017 (JP) .................. 2017-047403

(51) Int. Cl.
*H02H 6/00* (2006.01)
*H02H 3/08* (2006.01)
(Continued)

(52) U.S. Cl.
CPC ............... *H02H 6/00* (2013.01); *G01K 3/005* (2013.01); *G01K 7/42* (2013.01); *G01K 7/427* (2013.01);
(Continued)

(58) Field of Classification Search
CPC ............. H02H 6/00; G01K 3/005; G01K 7/42
See application file for complete search history.

(56) References Cited

U.S. PATENT DOCUMENTS

2005/0270709 A1* 12/2005 Plemmons ............. H02H 6/005
361/32
2007/0253132 A1 11/2007 Nakamura et al.
(Continued)

FOREIGN PATENT DOCUMENTS

JP 2007-295776 A 11/2007

*Primary Examiner* — Scott Bauer
(74) *Attorney, Agent, or Firm* — Sughrue Mion, PLLC

(57) ABSTRACT

An electric wire protection device includes a voltage adjuster that adjusts voltage on a power source side to be supplied to a load and a controller that includes a temperature calculation part which calculates temperature information of an electric wire based on a current value flowing through the voltage adjuster. The controller sets a first time constant as a time constant used to calculate the temperature information while the voltage adjuster is in the interrupted state, and sets a second time constant as a time constant used to calculate the temperature information while the voltage adjuster supplies power to the load. The first time constant is a value larger than the second time constant and equal to or larger than an actual time constant of the electric wire, and the second time constant is a value smaller than the actual time constant of the electric wire.

2 Claims, 4 Drawing Sheets

(51) Int. Cl.
*G01K 3/00* (2006.01)
*G01K 7/42* (2006.01)
*H02H 5/04* (2006.01)
*H02H 7/22* (2006.01)
*G01R 19/00* (2006.01)
*H02H 7/26* (2006.01)
*H01H 11/00* (2006.01)

(52) U.S. Cl.
CPC ........... G01R 19/0092 (2013.01); H02H 3/08 (2013.01); H02H 5/04 (2013.01); H02H 7/226 (2013.01); *G01K 2205/00* (2013.01); *G01K 2217/00* (2013.01); *H01H 2011/0068* (2013.01); *H02H 7/268* (2013.01)

(56) References Cited

U.S. PATENT DOCUMENTS

| | | | | |
|---|---|---|---|---|
| 2010/0254059 | A1* | 10/2010 | Higuchi | G01K 3/005 |
| | | | | 361/103 |
| 2012/0176115 | A1* | 7/2012 | Higuchi | H02H 3/087 |
| | | | | 323/311 |
| 2013/0293004 | A1* | 11/2013 | Higuchi | H02M 3/156 |
| | | | | 307/9.1 |
| 2015/0116883 | A1* | 4/2015 | Kimoto | B60R 16/02 |
| | | | | 361/103 |
| 2017/0294918 | A1* | 10/2017 | Illing | H02H 3/38 |
| 2018/0248354 | A1* | 8/2018 | Sugisawa | H02H 3/087 |

* cited by examiner

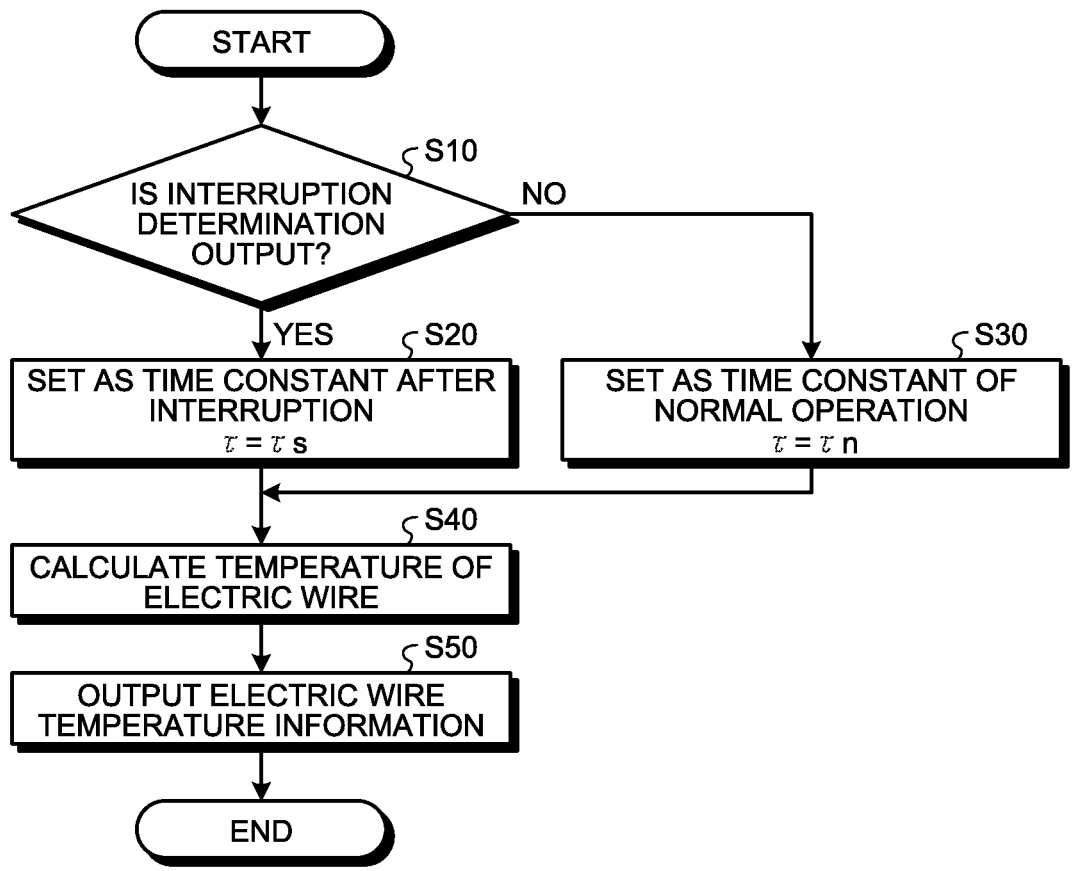

ELECTRIC WIRE PROTECTION DEVICE

CROSS-REFERENCE TO RELATED APPLICATION(S)

The present application claims priority to and incorporates by reference the entire contents of Japanese Patent Application No. 2017-047403 filed in Japan on Mar. 13, 2017.

BACKGROUND OF THE INVENTION

1. Field of the Invention

The present invention relates to an electric wire protection device.

2. Description of the Related Art

There is conventionally known a technique of calculating temperature of an electric wire and interrupting a load circuit. Japanese Patent Application Laid-open No. 2007-295776 discloses a technique of a protection device for a load circuit that calculates a temperature rise in an electric wire based on a thermal characteristic (thermal resistance, thermal capacity) of the electric wire or a contact conductor when a current flowing through a load is rising, calculates a temperature rise due to an arc when the arc is generated, and calculates a temperature drop in the electric wire based on the thermal characteristic of the electric wire when a current flowing through the load is zero or reduced.

However, in such a conventional technique, there is room for improvement in a technique of protecting an electric wire. For example, when an estimated temperature of the electric wire becomes lower than actual temperature of the electric wire, timing for interrupting energization may be delayed. It is demanded to protect the electric wire by appropriately estimating the temperature of the electric wire.

SUMMARY OF THE INVENTION

An object of the present invention is to provide an electric wire protection device that can appropriately protect the electric wire.

In order to achieve the above mentioned object, an electric wire protection device according to one aspect of the present invention includes a voltage adjuster that adjusts voltage on a power source side to be supplied to a load, and a controller that includes a temperature calculation part which calculates temperature information of an electric wire which connects a power source with the load based on a current value flowing through the voltage adjuster, and that is configured to cause the voltage adjuster to be in an interrupted state to interrupt connection between the power source and the load based on the temperature information, wherein the controller is configured to set a first time constant as a time constant which is used to calculate the temperature information while the voltage adjuster is in the interrupted state, and to set a second time constant as a time constant which is used to calculate the temperature information while the voltage adjuster supplies power to the load, the first time constant has a value larger than the second time constant and equal to or larger than an actual time constant of the electric wire, and the second time constant has a value smaller than the actual time constant of the electric wire.

According to another aspect of the present invention, in the electric wire protection device, the first time constant may have a value larger than an actual time constant of the electric wire.

The above and other objects, features, advantages and technical and industrial significance of this invention will be better understood by reading the following detailed description of presently preferred embodiment of the invention, when considered in connection with the accompanying drawings.

BRIEF DESCRIPTION OF THE DRAWINGS

FIG. 2 is an explanatory diagram of interruption determination according to the embodiment;

FIG. 3 is a flowchart illustrating an operation of the electric wire protection device according to the embodiment;

DETAILED DESCRIPTION OF THE PREFERRED EMBODIMENTS

The following describes an electric wire protection device according to an embodiment of the present invention in detail with reference to the drawings. The present invention is not limited to the embodiment. Components in the embodiment described below include a component easily conceivable by those skilled in the art or substantially the same component.

Embodiment

Figure 1:
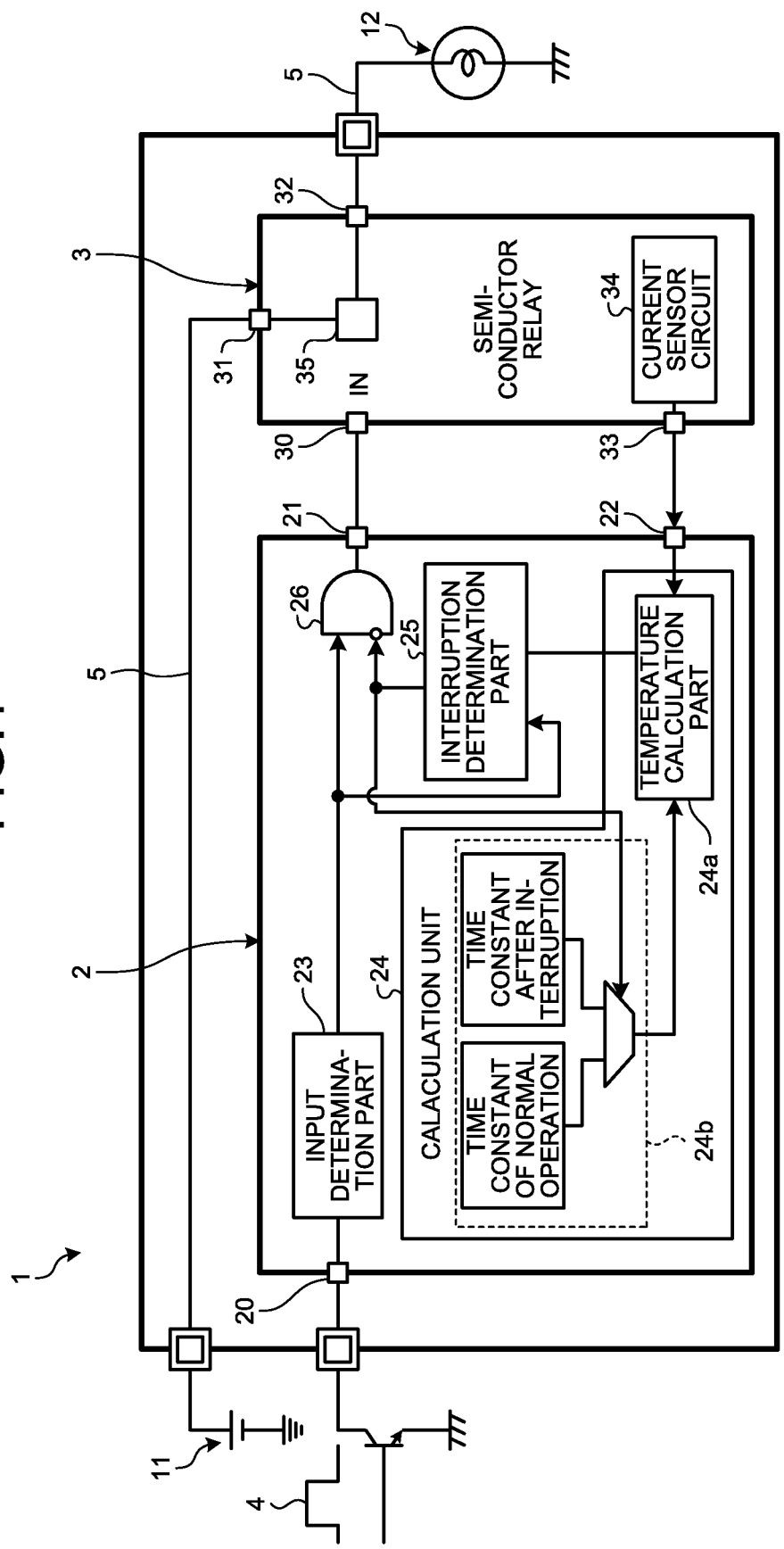
FIG. 1 is a diagram illustrating an electric wire protection device according to an embodiment.
Figure 4:
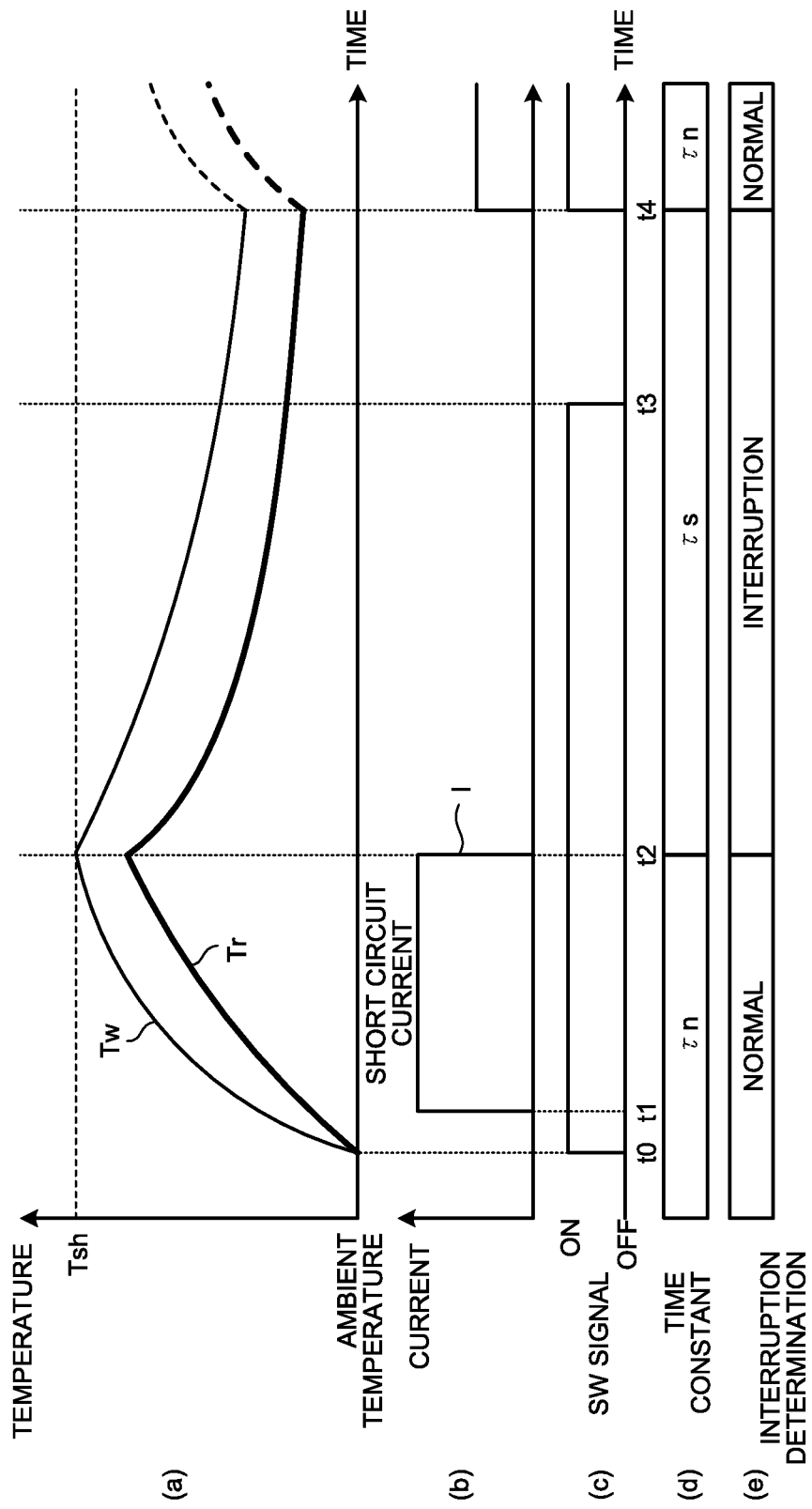
FIG. 4 is a time chart illustrating the operation of the electric wire protection device according to the embodiment.
Figure 5:
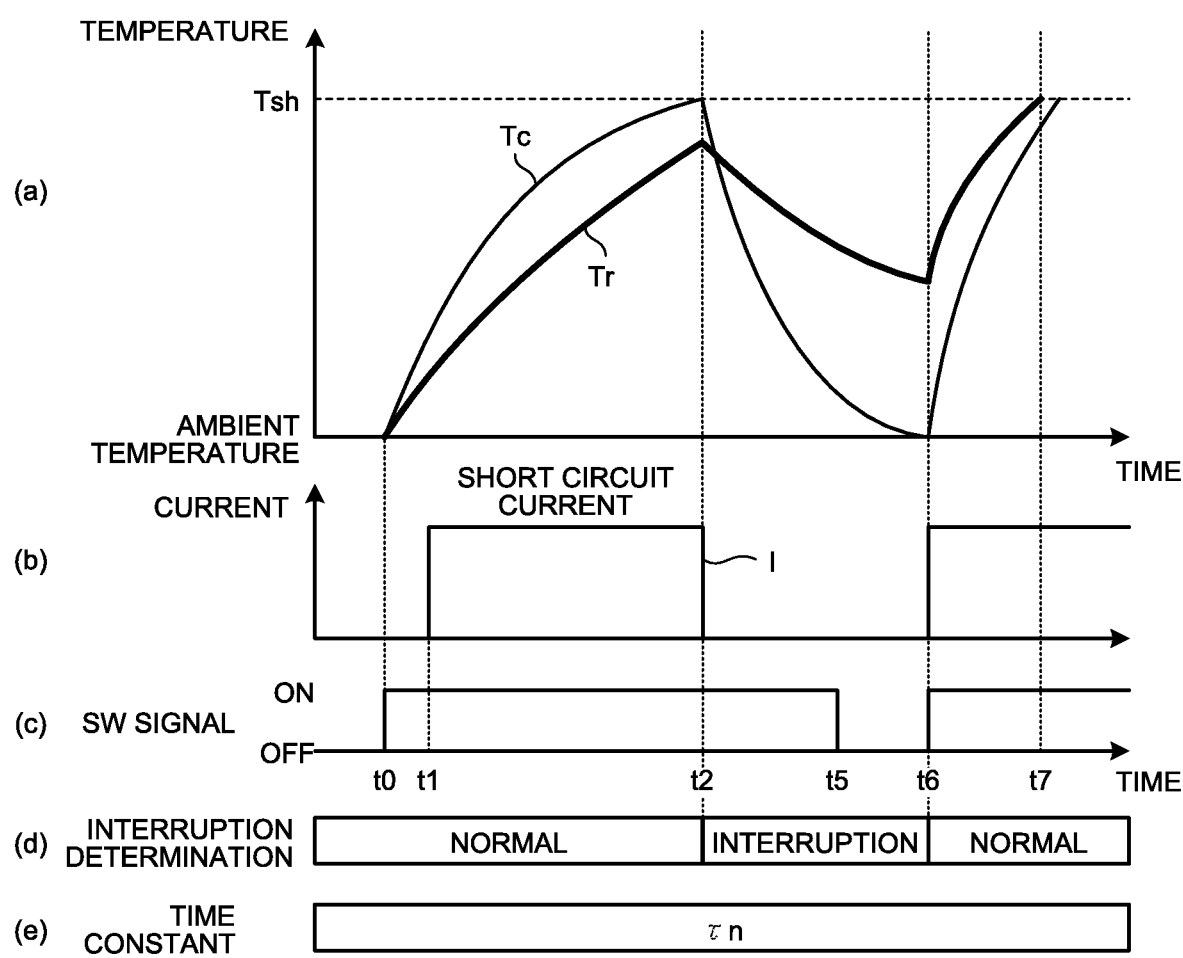
FIG. 5 is a time chart illustrating an operation according to a comparative example.

The following describes the embodiment with reference to FIGS. 1 to 5. The embodiment relates to an electric wire protection device. FIG. 1 is a diagram illustrating the electric wire protection device according to the embodiment, FIG. 2 is an explanatory diagram of interruption determination according to the embodiment, FIG. 3 is a flowchart illustrating an operation of the electric wire protection device according to the embodiment, FIG. 4 is a time chart illustrating the operation of the electric wire protection device according to the embodiment, and FIG. 5 is a time chart illustrating an operation according to a comparative example.

As illustrated in FIG. 1, an electric wire protection device 1 according to the embodiment includes a voltage adjuster 3 and a controller 2. The electric wire protection device 1 is mounted on a vehicle, and supplies power to an electric load (hereinafter, simply referred to as a "load") 12 of the vehicle. The load 12 to which power is supplied by the electric wire protection device 1 is, for example, a lamp such as a headlight of the vehicle. The electric wire protection device 1 controls voltage supplied to the load 12 with the voltage adjuster 3, and interrupts power supply to the load 12 by software. The electric wire protection device 1 estimates a heating value and a heat radiation amount of the electric wire based on a current value flowing through the voltage adjuster 3, and interrupts power supply to the load 12 based on an estimation result. The following describes the electric wire protection device 1 according to the present embodiment in detail.

The voltage adjuster 3 according to the present embodiment is a semiconductor relay which includes a signal input port 30, an input part 31, an output part 32, a signal output port 33, a current sensor circuit 34, and a semiconductor switching element 35. The signal input port 30 is electrically connected to a control signal output port 21 of the controller 2. The input part 31 is electrically connected to a power source 11 of the vehicle. The power source 11 is, for example, a secondary cell such as a battery. The output part 32 is electrically connected to the load 12.

The semiconductor switching element 35 is interposed between the input part 31 and the output part 32. The semiconductor switching element 35 connects or interrupts connection between the input part 31 and the output part 32 in accordance with ON/OFF of a control signal. The semiconductor switching element 35 is, for example, a metal-oxide-semiconductor field-effect transistor (MOSFET). The voltage adjuster 3 performs duty control on the semiconductor switching element 35 using a control circuit (not illustrated). The duty control on the semiconductor switching element 35 is, for example, PWM (Pulse Width Modulation) control. The control circuit determines a duty ratio of the duty control based on input voltage from the power source 11 and a target value of supply voltage to the load 12. The duty ratio is determined to cause effective voltage to the load 12 to be the target value of the supply voltage.

The current sensor circuit 34 detects the current value that flows via the semiconductor switching element 35. In other words, the current sensor circuit 34 detects the current value flowing from the power source 11 via the voltage adjuster 3 to the load 12. A signal indicating a detection result of the current sensor circuit 34 is output from the signal output port 33. The signal output port 33 is electrically connected to a current signal input port 22 of the controller 2.

The controller 2 controls activation/stop of the voltage adjuster 3. The controller 2 is, for example, a control circuit or a control device such as a microcomputer. The controller 2 includes an arithmetic part, a storage part, a communication part, and the like, and includes a computer program and a circuit configuration which execute the operation according to the present embodiment. The controller 2 includes a command signal input port 20, the control signal output port 21, the current signal input port 22, an input determination part 23, a calculation unit 24, an interruption determination part 25, and a logic circuit 26.

The command signal input port 20 is a port into which a command signal that activates the load 12 is input. The control signal output port 21 is a port from which a control signal for the voltage adjuster 3 is output. The current signal input port 22 is a port into which a signal related to the current value detected by the current sensor circuit 34 is input.

A switch 4 mounted on the vehicle is electrically connected to the command signal input port 20. The switch 4 is, for example, operated by a driver of the vehicle. When an operation input that activates the load 12 is performed on the switch 4, the switch 4 is switched from a stop command state to an activation command state. Switching between the stop command state and the activation command state of the switch 4 is, for example, switching between grounding and ungrounding. The switch 4 on which the operation input of an activation command is performed maintains the activation command state until the operation input for activation stop is performed.

The input determination part 23 is electrically connected to the command signal input port 20. The input determination part 23 outputs a signal corresponding to the state of the switch 4. More specifically, the input determination part 23 outputs an ON signal when the switch 4 is in the activation command state and outputs an OFF signal when the switch 4 is in the stop command state.

The calculation unit 24 is a circuit or an arithmetic device that calculates temperature information of an electric wire 5. The electric wire 5 as a temperature calculation target of the calculation unit 24 is, for example, the electric wire 5 connecting the power source 11 with the voltage adjuster 3, and the electric wire 5 connecting the voltage adjuster 3 with the load 12. The calculation unit 24 includes a temperature calculation part 24a and a time constant switching part 24b. The temperature calculation part 24a is electrically connected to the current signal input port 22. The temperature calculation part 24a acquires a signal indicating the current value detected by the current sensor circuit 34. The temperature calculation part 24a is electrically connected to the time constant switching part 24b. The temperature calculation part 24a acquires, from the time constant switching part 24b, a value of a time constant used to calculate the temperature.

The following describes a method of calculating the temperature by the temperature calculation part 24a according to the present embodiment with reference to expressions (1) to (4). In the expressions (1) to (4), Pcin represents exothermic energy [J/s] of the electric wire 5 per unit time, Pcout represents heat radiation energy [J/s] of the electric wire 5 per unit time, rc represents conductor resistance [Ω] of the electric wire 5, I represents an energizing current [A], Cth represents thermal capacity [J/° C.] of the electric wire 5, Rth represents thermal resistance [° C./W] of the electric wire 5, Qc(n) represents an amount of heat (cumulative value) [J] of the electric wire 5 at the time when the current value is sampled n-times, Δt represents sampling time (sampling interval) [s], and ΔT represents a temperature change amount (cumulative value) [° C.] in the electric wire 5.

$$P{cin} = rc \times I^2 \tag{1}$$

$$P{cout} = Qc(n-1)/(Cth \times Rth) \tag{2}$$

$$Qc(n) = Qc(n-1) + (P{cin} - P{cout}) \times \Delta t \tag{3}$$

$$\Delta T = Qc(n)/Cth \tag{4}$$

The temperature calculation part 24a calculates the temperature information at every fixed time based on the information of the current value acquired from the current sensor circuit 34 and a time constant τ acquired from the time constant switching part 24b. The temperature calculation part 24a outputs the calculated temperature information to the interruption determination part 25. The temperature information according to the present embodiment is information about current temperature of the electric wire 5, a temperature change amount, heat balance, and the like. The controller 2 causes the voltage adjuster 3 to be in an interrupted state based on the temperature information, and interrupts the connection between the power source 11 and the load 12. The interrupted state means a state in which power supply to the load 12 is continuously stopped in the voltage adjuster 3, and the duty control is not performed.

The temperature information according to the present embodiment is an estimation value of the current temperature of the electric wire 5. In the following description, the current temperature of the electric wire 5 calculated by the temperature calculation part 24a is simply referred to as "estimated temperature Tw." The estimated temperature Tw is current temperature of the electric wire 5 estimated by the temperature calculation part 24a. The estimated temperature Tw of the electric wire 5 is calculated as a sum of ambient temperature Tamb of the electric wire 5 and the temperature change amount ΔT, for example. The ambient temperature Tamb may be a value stored in advance, or a value actually measured, for example. For example, as the ambient temperature Tamb, there is stored temperature of the electric wire 5 in a steady state at the time when the voltage adjuster 3 supplies a rated current to the load 12.

The interruption determination part 25 outputs a determination result based on a signal of the input determination part 23 and the estimated temperature Tw (temperature information) acquired from the temperature calculation part 24a. The interruption determination part 25 performs, for example, interruption determination as illustrated in FIG. 2. FIG. 2 illustrates a signal (SW) of the input determination part 23, the estimated temperature Tw, and content of interruption determination performed by the interruption determination part 25. If the input determination part 23 outputs the ON signal and the estimated temperature Tw is equal to or higher than a predetermined interruption temperature Tsh (HI), the interruption determination part 25 outputs the ON signal. This ON signal is an interruption command to cause the voltage adjuster 3 to be in the interrupted state. On the other hand, if the input determination part 23 outputs the ON signal and the estimated temperature Tw is lower than the interruption temperature Tsh (LOW), the interruption determination part 25 outputs the OFF signal. This OFF signal is a normal command that allows power supply from the voltage adjuster 3 to the load 12. The interruption determination part 25 maintains the content of the interruption determination until the signal of the input determination part 23 is reset. In other words, after determining to cause the voltage adjuster 3 to be in the interrupted state, the interruption determination part 25 continues to output the ON signal from the time when the signal of the input determination part 23 is temporarily turned OFF until the signal is turned ON again. When the signal of the input determination part 23 is switched from ON to OFF in a state in which the interruption determination part 25 outputs the OFF signal, the interruption determination part 25 continues outputting the OFF signal until the signal of the input determination part 23 is turned ON again.

The logic circuit 26 outputs a control signal corresponding to the signal of the input determination part 23 and a signal of the interruption determination part 25. The output signal of the interruption determination part 25 is input to the logic circuit 26 while ON/OFF thereof is reversed. That is, the ON signal of the interruption determination part 25 is reversed into the OFF signal to be input into the logic circuit 26, and the OFF signal of the interruption determination part 25 is reversed into the ON signal to be input into the logic circuit 26. The logic circuit 26 is an AND circuit. When the output signal of the input determination part 23 is ON and the interruption determination part 25 outputs the OFF signal, the logic circuit 26 outputs the ON signal from the control signal output port 21. The ON signal output by the logic circuit 26 is a supply command signal that instructs to execute power supply to the load 12.

On the other hand, when the output signal of the input determination part 23 is OFF or the interruption determination part 25 outputs the ON signal, the logic circuit 26 outputs the OFF signal through the control signal output port 21. The OFF signal output by the logic circuit 26 is a stop command signal that instructs to stop the power supply to the load 12. The stop command signal output from the logic circuit 26 when the interruption determination part 25 outputs the ON signal functions as an interruption command signal that protects the electric wire 5 by causing the voltage adjuster 3 to be in the interrupted state. When the voltage adjuster 3 continuously interrupts the connection between the power source 11 and the load 12 in accordance with the stop command signal, energization to the electric wire 5 is stopped, and heat generation of the electric wire 5 is stopped. As a result, a further temperature rise in the electric wire 5 is suppressed.

The time constant switching part 24b outputs different time constants τ depending on the output signal of the interruption determination part 25. The time constant τ output by the time constant switching part 24b according to the present embodiment is a product of thermal capacity Cth of the electric wire 5 and the thermal resistance Rth of the electric wire 5, and represented by the following expression (5).

$$\tau = Cth \times Rth \qquad (5)$$

The time constant switching part 24b outputs any of a first time constant τs and a second time constant τn as the time constant τ. The first time constant τs is output by the time constant switching part 24b when the output signal of the interruption determination part 25 is ON. That is, the first time constant τs is output in a period in which the interruption command is output by the interruption determination part 25 and the voltage adjuster 3 is in the interrupted state. The second time constant τn is output by the time constant switching part 24b when the output signal of the interruption determination part 25 is OFF. That is, the second time constant τn is output by the time constant switching part 24b in a normal period in which the interruption command is not output by the interruption determination part 25.

The second time constant τn in the present embodiment is a value smaller than an actual time constant τr of the electric wire 5. The actual time constant τr of the electric wire 5 is a time constant corresponding to a physical property of the electric wire 5. Accordingly, a degree of rise in the estimated temperature Tw calculated by the temperature calculation part 24a is higher than the degree of rise in the actual temperature Tr. That is, the estimated temperature Tw calculated with the actual time constant τr is a safer value in view of protecting the electric wire 5 from heat.

The first time constant τs in the present embodiment is a value larger than the second time constant τn, and equal to or larger than the actual time constant τr of the electric wire 5. That is, when energization to the electric wire 5 is interrupted and the temperature of the electric wire 5 is lowered, the value of the time constant τ is equal to or larger than the actual time constant τr of the electric wire 5. As a result, a large/small relation between the estimated temperature Tw and the actual temperature Tr is prevented from being reversed. As illustrated in a period from time t2 to time t3 in FIG. 4, the estimated temperature Tw changes being a larger value than the actual temperature Tr. At the time t2, the estimated temperature Tw is higher than the actual temperature Tr. When the temperature of the electric wire 5 is lowered from this state, a degree of lowering of the estimated temperature Tw is equal to the degree of lowering of the actual temperature Tr, or lower than the degree of lowering of the actual temperature Tr. Thus, the estimated temperature Tw is prevented from being estimated to be lower than the actual temperature Tr.

The following describes an operation of the electric wire protection device 1 according to the present embodiment with reference to FIGS. 3 and 4. The flowchart illustrated in FIG. 3 is, for example, repeatedly executed in a state in which an ignition of the vehicle is ON. In the time chart of FIG. 4, a horizontal axis indicates time. FIG. 4 illustrates (a) temperature, (b) current, (c) output signal (SW) of the input determination part 23, (d) time constant τ, and (e) interruption determination result obtained by the interruption determination part 25. In a column of (a) temperature, the actual temperature Tr of the electric wire 5 is illustrated in addition to the estimated temperature Tw estimated by the temperature calculation part 24a.

In FIG. 4, the switch 4 is turned ON at time t0, and a power supply command is output to the voltage adjuster 3. At this point, the interruption determination result of the interruption determination part 25 is normal, and the interruption determination part 25 outputs the OFF signal. Thus, the value of the time constant τ is the second time constant τn. At time t1, a short circuit current starts to flow because an anomaly occurs. Due to the short circuit current, each of the actual temperature Tr and the estimated temperature Tw starts to rise. The estimated temperature Tw rises faster than the actual temperature Tr because the second time constant τn is a value smaller than the actual time constant τr. At the time t2, the estimated temperature Tw reaches the interruption temperature Tsh, and the interruption determination result obtained by the interruption determination part 25 is changed to "interruption." The interruption determination part 25 starts to output the ON signal as the interruption command. In accordance with the interruption command from the interruption determination part 25, the value of the time constant τ is changed from the second time constant τn to the first time constant τs.

With the electric wire protection device 1 according to the present embodiment, through the operation illustrated in the flowchart of FIG. 3, the estimated temperature Tw after interruption changes being a larger value than the actual temperature Tr. Thus, when the switch 4 is turned ON again, the temperature of the electric wire 5 is estimated from a state in which the estimated temperature Tw is higher than the actual temperature Tr. As a result, the electric wire 5 is protected from heat more securely.

With reference to FIG. 3, in Step S10, the time constant switching part 24b determines whether the interruption determination is output. The time constant switching part 24b makes positive determination in Step S10 when the output signal from the interruption determination part 25 is ON, and advances the process to Step S20. On the other hand, the time constant switching part 24b makes negative determination in Step S10 when the output signal from the interruption determination part 25 is OFF, and advances the process to Step S30. In FIG. 4, negative determination is made in Step S10 until the time t2, and positive determination is made in Step S10 from the time t2 to time t4.

In Step S20, the time constant switching part 24b sets the first time constant τs as a time constant after interruption as the value of the time constant τ to be output. When Step S20 is executed, the process proceeds to Step S40.

In Step S30, the time constant switching part 24b sets the second time constant τn as a time constant of a normal operation as the value of the time constant τ to be output. When Step S30 is executed, the process proceeds to Step S40.

In Step S40, the temperature calculation part 24a calculates the estimated temperature Tw of the electric wire 5 with the time constant τ acquired from the time constant switching part 24b. The temperature calculation part 24a acquires the current value sampled by the current sensor circuit 34, and calculates the estimated temperature Tw using the currently set value of the time constant τ. When the process proceeds to Step S40 after the first time constant τs is set as the time constant τ in Step S20, the temperature calculation part 24a calculates the estimated temperature Tw of the electric wire 5 using the first time constant τs. On the other hand, when the process proceeds to Step S40 after the second time constant τn is set as the time constant τ in Step S30, the temperature calculation part 24a calculates the estimated temperature Tw of the electric wire 5 using the second time constant τn. When Step S40 is executed, the process proceeds to Step S50.

In Step S50, the temperature calculation part 24a outputs electric wire temperature information. The temperature calculation part 24a outputs, to the interruption determination part 25, the estimated temperature Tw of the electric wire 5 updated in Step S40. When Step S50 is executed, this control procedure is temporarily ended.

With reference to FIG. 4, the following describes the operation of the electric wire protection device 1 after the time t2. When the interruption determination part 25 outputs the interruption command at the time t2, the time constant τ is switched from the second time constant τn to the first time constant τs, and the voltage adjuster 3 is caused to be in the interrupted state. Accordingly, an energizing current I of the electric wire 5 becomes 0, and each of the actual temperature Tr and the estimated temperature Tw starts to be lowered. In the present embodiment, the first time constant τs is a value larger than the actual time constant τr of the electric wire 5. That is, the degree of lowering of the estimated temperature Tw is lower than the degree of lowering of the actual temperature Tr.

The switch 4 is turned OFF at the time t3. The interruption determination result obtained by the interruption determination part 25 is maintained even when the switch 4 is switched from ON to OFF. When the switch 4 is turned ON again at the time t4, the interruption determination part 25 updates the interruption determination result based on the estimated temperature Tw at the time t4. In other words, after the switch 4 is turned OFF and until the switch 4 is turned ON again, the interruption determination part 25 maintains the interruption determination result at the time when the switch 4 is turned OFF. In accordance with such a function of maintaining the result of the interruption determination part 25, the value of the time constant τ is maintained at the first time constant τs from the time t2 until the time t4.

When the switch 4 is turned ON at the time t4, the estimated temperature Tw is higher than the actual temperature Tr. Thus, when the actual temperature Tr of the electric wire 5 rises due to energization to the electric wire 5, the estimated temperature Tw changes being a higher value than the actual temperature Tr. Accordingly, the estimated temperature Tw reaches the interruption temperature Tsh before the actual temperature Tr of the electric wire 5 reaches the interruption temperature Tsh, and the voltage adjuster 3 is caused to be in the interrupted state. As a result, the electric wire protection device 1 can prevent the temperature of the electric wire 5 from excessively rising.

In the present embodiment, the second time constant τn is a value smaller than the actual time constant τr of the electric wire 5, so that rising speed of the estimated temperature Tw is higher than the rising speed of the actual temperature Tr. Accordingly, the temperature of the electric wire 5 is prevented from excessively rising more securely.

The following describes an effect of the electric wire protection device 1 according to the present embodiment with reference to a comparative example illustrated in FIG. 5. In the comparative example illustrated in FIG. 5, illustrated is a temperature change in a case in which the second time constant τn is used as the time constant τ after the voltage adjuster 3 is interrupted. In FIG. 5, estimated temperature Tc of the comparative example is illustrated in a column of the temperature. The estimated temperature Tc of the comparative example is calculated by using the second time constant τn irrespective of whether the voltage adjuster 3 executes power supply to the load 12 or is in the interrupted state.

As illustrated in FIG. 5, the switch 4 is turned ON at the time t0, and the short circuit current starts to flow in the electric wire 5 at the time t1. Similarly to the estimated temperature Tw according to the present embodiment, the estimated temperature Tc of the comparative example rises faster than the actual temperature Tr to reach the interruption temperature Tsh. When the estimated temperature Tc of the comparative example reaches the interruption temperature Tsh at the time t2, the interruption determination result is switched from "normal" to "interruption." As a result, the voltage adjuster 3 is caused to be in the interrupted state, and each of the actual temperature Tr and the estimated temperature Tc of the comparative example is lowered.

The second time constant τn is a value smaller than the actual time constant τr of the electric wire 5, so that the estimated temperature Tc of the comparative example is lowered faster than the actual temperature Tr. After the switch 4 is turned OFF at time t5, the switch 4 is turned ON again at time t6. At this point, the estimated temperature Tc of the comparative example is lower than the actual temperature Tr. As a result, the estimated temperature Tc of the comparative example after the time t6 changes being a lower value than the actual temperature Tr. The short circuit current starts to flow in the electric wire 5 at the time t6, and the actual temperature Tr reaches the interruption temperature Tsh at time t7. At this point, the estimated temperature Tc of the comparative example is kept being lower than the interruption temperature Tsh. In this way, in the comparative example, the actual temperature Tr may exceed the interruption temperature Tsh.

On the other hand, the electric wire protection device 1 according to the present embodiment can preferably prevent the estimated temperature Tw from being lower than the actual temperature Tr. As a result, the electric wire protection device 1 can appropriately protect the electric wire 5 and the load 12.

As described above, the electric wire protection device 1 according to the present embodiment includes the voltage adjuster 3 and the controller 2. The voltage adjuster 3 adjusts the voltage on the power source 11 side to be supplied to the load 12. The controller 2 includes the temperature calculation part 24a that calculates the temperature information of the electric wire 5 based on the current value flowing through the voltage adjuster 3. The controller 2 causes the voltage adjuster 3 to be in the interrupted state for interrupting the connection between the power source 11 and the load 12 based on the temperature information.

The controller 2 sets the first time constant τs as the time constant τ used for calculating the temperature information while the voltage adjuster 3 is in the interrupted state, and sets the second time constant τn as the time constant τ used for calculating the temperature information while the voltage adjuster 3 supplies power to the load 12. The first time constant τs is a value larger than the second time constant τn and equal to or larger than the actual time constant τr of the electric wire 5. The second time constant τn is a value smaller than the actual time constant τr of the electric wire 5.

In the electric wire protection device 1 according to the present embodiment, the second time constant τn is assumed to be a value smaller than the actual time constant τr of the electric wire 5. Thus, while the voltage adjuster 3 supplies power to the load 12 in accordance with duty control, the degree of rise of the estimated temperature Tw becomes higher than the degree of rise of the actual temperature Tr. Thus, the estimated temperature Tw tends to reach the interruption temperature Tsh faster than the actual temperature Tr, and the electric wire 5 is appropriately protected.

Additionally, the first time constant τs is a value larger than the second time constant τn and equal to or larger than the actual time constant τr of the electric wire 5. Thus, the degree of lowering of the estimated temperature Tw at the time when the voltage adjuster 3 is in the interrupted state may be equal to the degree of lowering of the actual temperature Tr, or may be lower than the degree of lowering of the actual temperature Tr. As a result, when energization to the electric wire 5 is started again from the interrupted state, the estimated temperature Tw is at least equal to or larger than the actual temperature Tr. Accordingly, the electric wire protection device 1 according to the present embodiment can appropriately protect the electric wire 5 from an excessive temperature rise.

In the electric wire protection device 1 according to the present embodiment, the first time constant τs is assumed to be a value larger than the actual time constant τr of the electric wire 5. Thus, while the voltage adjuster 3 is in the interrupted state, the degree of lowering of the estimated temperature Tw is lower than the degree of lowering of the actual temperature Tr.

Accordingly, the estimated temperature Tw becomes higher than the actual temperature Tr when energization to the electric wire 5 is started again, and the electric wire 5 is appropriately protected.

Modification of Embodiment

The following describes a modification of the embodiment. In the electric wire protection device 1, a module for adjusting the voltage on the power source 11 side to be supplied to the load is not limited to the semiconductor switching element. The semiconductor switching element 35 is not limited to the MOSFET. Another switching element may be used as the semiconductor switching element 35. The load 12 is not limited to the lamp. The load 12 may be an electric load other than the lamp.

The temperature information calculated by the temperature calculation part 24a is not limited to the estimated temperature Tw of the electric wire 5. The temperature information is information about the temperature of the electric wire 5, or information about a physical quantity related to the temperature of the electric wire 5. The temperature information referred to by the controller 2 in interruption determination may be, for example, the temperature change amount ΔT or the amount of heat Qc.

The pieces of content disclosed in the embodiment and the modification described above may be appropriately combined to be executed.

The electric wire protection device according to the present embodiment includes the voltage adjuster that adjusts the voltage on the power source side to be supplied to the load, and a controller that includes the temperature calculation part which calculates the temperature information of the electric wire connecting the power source with the load based on the current value flowing through the voltage adjuster and causes the voltage adjuster to be in the interrupted state for interrupting the connection between the power source and the load based on the temperature information. The controller sets the first time constant as the time constant used for calculating the temperature information while the voltage adjuster is in the interrupted state, and sets the second time constant as the time constant used for calculating the temperature information while the voltage adjuster supplies power to the load. The first time constant is a value larger than the second time constant and equal to or larger than the actual time constant of the electric wire, and the second time constant is a value smaller than the actual time constant of the electric wire.

With the electric wire protection device according to the present embodiment, the degree of rise of the estimated temperature of the electric wire is larger than the degree of rise of the actual temperature at the time of supplying power, and the degree of lowering of the estimated temperature is equal to or lower than the degree of lowering of the actual temperature in the interrupted state. Accordingly, the electric wire protection device according to the present invention can appropriately protect the electric wire.

Although the invention has been described with respect to the specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric wire protection device comprising:
   a voltage adjuster that adjusts voltage on a power source side to be supplied to a load; and
   a controller that includes a temperature calculation part which calculates temperature information of an electric wire which connects a power source with the load based on a current value flowing through the voltage adjuster, and that is configured to cause the voltage adjuster to be in an interrupted state to interrupt connection between the power source and the load based on the temperature information, wherein
   the controller is configured to set a first time constant as a time constant which is used to calculate the temperature information while the voltage adjuster is in the interrupted state, and to set a second time constant as a time constant which is used to calculate the temperature information while the voltage adjuster supplies power to the load,
   the first time constant has a value larger than the second time constant and equal to or larger than an actual time constant of the electric wire, and
   the second time constant has a value smaller than the actual time constant of the electric wire.

2. The electric wire protection device according to claim 1, wherein
   the first time constant has a value larger than an actual time constant of the electric wire.

* * * * *